(12) United States Patent
Bi

(10) Patent No.: US 10,356,919 B2
(45) Date of Patent: Jul. 16, 2019

(54) FOLDABLE MODULE AND FLEXIBLE DISPLAY DEVICE HAVING THE SAME

(71) Applicant: WUHAN CHINA STAR OPTOELECTRONICS SEMICONDUCTOR DISPLAY TECHNOLOGY CO., LTD., Wuhan (CN)

(72) Inventor: Wei Bi, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 15/576,830

(22) PCT Filed: Nov. 8, 2017

(86) PCT No.: PCT/CN2017/109836
§ 371 (c)(1),
(2) Date: Nov. 26, 2017

(87) PCT Pub. No.: WO2019/051967
PCT Pub. Date: Mar. 21, 2019

(65) Prior Publication Data
US 2019/0090363 A1    Mar. 21, 2019

(51) Int. Cl.
*H05K 5/00* (2006.01)
*H05K 5/02* (2006.01)
*E05D 7/00* (2006.01)

(52) U.S. Cl.
CPC ......... *H05K 5/0017* (2013.01); *H05K 5/0226* (2013.01); *E05D 7/00* (2013.01); *E05Y 2900/606* (2013.01)

(58) Field of Classification Search
CPC ...... H05K 5/0017; H05K 5/0226; E05D 7/00; E05Y 2900/606
USPC .......................................... 361/755
See application file for complete search history.

(56) References Cited

U.S. PATENT DOCUMENTS

| | | | |
|---|---|---|---|
| 9,786,207 B2 * | 10/2017 | Kim | G09F 9/301 |
| 2002/0112318 A1 * | 8/2002 | Shin | G06F 1/1616 16/319 |
| 2014/0065326 A1 | 3/2014 | Lee | |
| 2015/0330614 A1 | 11/2015 | Lee et al. | |
| 2015/0362956 A1 * | 12/2015 | Tazbaz | G06F 1/1637 361/679.27 |

(Continued)

FOREIGN PATENT DOCUMENTS

| CN | 103228114 A | 7/2013 |
|---|---|---|
| CN | 105096756 A | 11/2015 |

(Continued)

*Primary Examiner* — Hung S. Bui
(74) *Attorney, Agent, or Firm* — JMB Davis Ben-David

(57) ABSTRACT

A foldable module and a flexible display device are provided. The foldable module includes a metal frame disposed along a periphery of a flexible display panel, a protective housing configured to hold the flexible display panel and the metal frame, and a flexible hinge for securing to the protective housing. The flexible hinge includes rotating shafts, fixed washers, biasing gaskets, movable washers, and disc springs. The flexible can achieve that it is positioned within a predetermined angular range.

14 Claims, 6 Drawing Sheets

(56) References Cited

U.S. PATENT DOCUMENTS

2015/0370287 A1* 12/2015 Ko ..................... G06F 1/1626
                                                                     361/749
2017/0094775 A1    3/2017 Fan et al.
2017/0328102 A1* 11/2017 Kato .................... E05D 11/087

FOREIGN PATENT DOCUMENTS

CN        106557118 A    4/2017
CN        106847093 A    6/2017

* cited by examiner

FOLDABLE MODULE AND FLEXIBLE DISPLAY DEVICE HAVING THE SAME

CROSS-REFERENCE TO RELATED APPLICATIONS

This is the U.S. National Stage of International Patent Application No. PCT/CN2017/109836, filed Nov. 8, 2017, which in turn claims the benefit of Chinese Patent Application No. 201710831740.3, filed Sep. 15, 2017.

FIELD OF INVENTION

This disclosure relates to display technology, and more particularly to a foldable module and a flexible display device having the same.

BACKGROUND OF INVENTION

Because the flexible display panels have the advantages of light and thin, non-friable, bendable, foldable, and wearable, the flexible display panels are gaining more and more attentions.

At present, most of the foldable flexible display panels do not have flexible hinges. They usually use torque-free hinges. The flexible display panels are prone to wrinkle under the bending and folding state, and the bending angle is not easy to maintain. In the natural state the bent flexible display panels are easy to return back to their original shapes.

The prior art foldable members and their assembled flexible display devices may cause the display panels to be wrinkled during the folding process; the bent angle is not easily to control; and in the natural state, the bent angle is not easy to maintain.

SUMMARY OF INVENTION

The object of the present invention to provide a foldable module and a flexible display device capable of realizing bending without wrinkling and folding function, and realizing an arbitrary positioning within a predetermined angular range, as well as to have a shape-memory effect and high elasticity, and quickly restored to the original state. Thereby the performance of the flexible display device is improved.

Thus, it is necessary to provide a foldable module and a flexible display device to solve the problems of the prior art; the technical options are as follows:

This disclosure provides a foldable module, comprising:
a metal frame disposed along a periphery of a flexible display panel;
a protective housing configured to hold the flexible display panel and the metal frame; and
a flexible hinge secured to the protective housing for positioning within a predetermined angular range;
wherein the flexible hinge includes rotating shafts, fixed washers, biasing gaskets, movable washers, and disc springs. The rotating shafts are configured to axially engage the fixed washers, the biasing gaskets, the movable washers, and the disc springs, and are assembled therewith as a whole. A distance between axes of two adjacent rotating shafts is kept constant.

The fixed washers are configured to tightly fit with the biasing gaskets and form an interference fit with the rotating shafts, wherein the movable washers and the disc springs are configured to form a clearance fit with the rotating shafts, and wherein the disc springs provide axial friction. The flexible hinge is fixedly positioned within a predetermined angular range by adjusting the torque.

In accordance with one embodiment, the flexible hinge comprises at least four rotating shafts, each of which is configured to be arranged with at least two disc springs butting together, and the symmetrical sides of the adjacent disc springs each are provided with one movable washer and two biasing gaskets; four biasing gaskets are arranged side by side on both ends of two movable washers, and wherein two of the fixed washers are provided at outer sides of the movable washer and the biasing gaskets so that the fixed washers are disposed to be staggered with respect to the movable washer and the biasing gaskets.

In accordance with one embodiment, the rotating shafts each have a shaft diameter of 0.5 mm~3.0 mm, both ends of the rotating shaft each are provided with a chamfering, and a middle portion is cylindrical, for assembling with the disc springs, and both sides of the rotating shaft are configured as planes.

In accordance with one embodiment, the fixed washers and the biasing gaskets are each provided with a corresponding perforation which is a rectangular perforation for having an interference fit with a corresponding shaft, and wherein the fixing washers each include a first perforation and a second perforation that assume different orientations to each other, the biasing gaskets each include a third perforation.

In accordance with one embodiment, the fixed washers each are provided with two centrally symmetrical small projections in a side surface thereof facing the biasing gaskets, and wherein a side of each of the biasing gaskets is provided with a small circular hole corresponding to one of the small projections of the fixed washer, the small circular hole forming a tight fit with the one of the small projections.

In accordance with one embodiment, the movable washers each comprise two centrally symmetrical fourth perforations for forming a clearance fit with the rotating shafts, and an outer periphery of each of the fourth perforations has an annular groove for accommodating the other one of the small projections of the fixed washer.

In accordance with one embodiment, the fixed washers each have a semicircular arc face at each of both ends thereof, whose wear resistance is greater than a predetermined value, and the semicircular arc faces of the two adjacent fixed washers cooperate to form an engaging and engaged relationship, and wherein one end of each the biasing gaskets comprises a handle for fixing to the protective housing.

In accordance with one embodiment, a thickness of each of the fixed washers is 0.1 mm to 2.0 mm, and wherein the thickness of each of the fixing washers, the movable washers, the biasing gaskets, and the disc springs is substantially the same to each other.

This disclosure provides a flexible display device, comprising:
a flexible display panel;
a foldable module for assembling to the flexible display panel;
wherein the foldable module comprises a metal frame is configured to attach the flexible display panel thereto for fixing the flexible display panel; a protective housing is configured to hold the flexible display panel and the metal frame; a flexible hinge for securing the protective housing to enable the housing and the flexible display panel to fold and position within a predetermined angular range.

This disclosure further provides a foldable module, comprising:

a metal frame disposed along a periphery of a flexible display panel;

a protective housing configured to hold the flexible display panel and the metal frame; and a flexible hinge for securing to the protective housing to enable the housing and the flexible display panel to fold and position within a predetermined angular range;

wherein the flexible hinge includes rotating shafts, fixed washers, biasing gaskets, movable washers, and disc springs. The rotating shafts configured to axially engage the fixed washers, the biasing gaskets, the movable washers, and the disc springs, and assembled therewith as a whole.

The fixed washers are configured to tight fit with the biasing gaskets and form an interference fit with the rotating shafts, the movable washers and the disc springs are configured to form a clearance fit with the rotating shafts, and wherein the disc springs provide axial friction to effect that the flexible hinge is be able to be located within a predetermined angular range by adjusting torque.

In accordance with one embodiment, the flexible hinge comprises at least four rotating shafts, each of which is configured to be arranged with at least two disc springs butting together, and the symmetrical sides of the adjacent disc springs each are provided with one movable washer and two biasing gaskets; four biasing gaskets are arranged side by side on both ends of two movable washers, and wherein two of the fixed washers are provided at outer sides of the movable washer and the biasing gaskets so that the fixed washers are disposed to be staggered with respect to the movable washer and the biasing gaskets.

In accordance with one embodiment, the rotating shafts each have a shaft diameter of 0.5 mm~3.0 mm, both ends of the rotating shaft each are provided with a chamfering, and a middle portion is cylindrical, for assembling with the disc springs, and both sides of the rotating shaft are configured as planes.

In accordance with one embodiment, the fixed washers and the biasing gaskets are each provided with a corresponding perforation which is a rectangular perforation for having an interference fit with a corresponding shaft, and wherein the fixing washers each include a first perforation and a second perforation that assume different orientations to each other, the biasing gaskets each include a third perforation.

In accordance with one embodiment, the fixed washers each are provided with two centrally symmetrical small projections in a side surface thereof facing the biasing gaskets, and wherein a side of each of the biasing gaskets is provided with a small circular hole corresponding to one of the small projections of the fixed washer, the small circular hole forming a tight fit with the one of the small projections.

In accordance with one embodiment, the movable washers each comprise two centrally symmetrical fourth perforations for forming a clearance fit with the rotating shafts, and an outer periphery of each of the fourth perforations has an annular groove for accommodating the other one of the small projections of the fixed washer.

In accordance with one embodiment, the fixed washers each have a semicircular arc face at each of both ends thereof, whose wear resistance is greater than a predetermined value, and the semicircular arc faces of the two adjacent fixed washers cooperate to form an engaging and engaged relationship, and wherein one end of each the biasing gaskets comprises a handle for fixing to the protective housing.

In accordance with one embodiment, a thickness of each of the fixed washers is 0.1 mm to 2.0 mm, and wherein the thickness of each of the fixing washers, the movable washers, the biasing gaskets, and the disc springs is substantially the same to each other.

In comparison with a conventional foldable member and flexible display device. the foldable module and the flexible display device according to the disclosure as constructed above has the following advantages, the disclosure provides a bendable, flexible hinge with adjustable torque is achieved by having components having the interference fit, clearance fit and tight fit with each other. Furthermore, a metal frame or a metal plate having a shape-memory effect, high toughness, and high elasticity, functions as a carrier of a flexible display panel. Under the action of the positioning of the flexible hinge and the elasticity of the metal frame or the metal plate, it is able to achieve the function of bending and folding the display without causing formation of wrinkles thereof. Accordingly, the disclosure can achieve an arbitrary stop at a desired position within a predetermined angular range, as well as the shape memory effect can be quickly restored to its original state. Thereby improving the performance of the flexible display device.

DESCRIPTION OF DRAWINGS

In order to more clearly describe the embodiments of this disclosure or the conventional technical solutions, the description is used to make a simple introduction of the drawings used in the following embodiments. The following description of the drawings are merely some embodiments of this disclosure. In order, more clearly describe the embodiments of this disclosure or the conventional technical solutions, the description is used to make a simple introduction of the drawings used in the following embodiments. The following description of the drawings are merely some embodiments of this disclosure. Those of ordinary skill in the art can also obtain other drawings based on these drawings without creative effort.

DETAILED DESCRIPTION OF PREFERRED EMBODIMENTS

Figure 1:
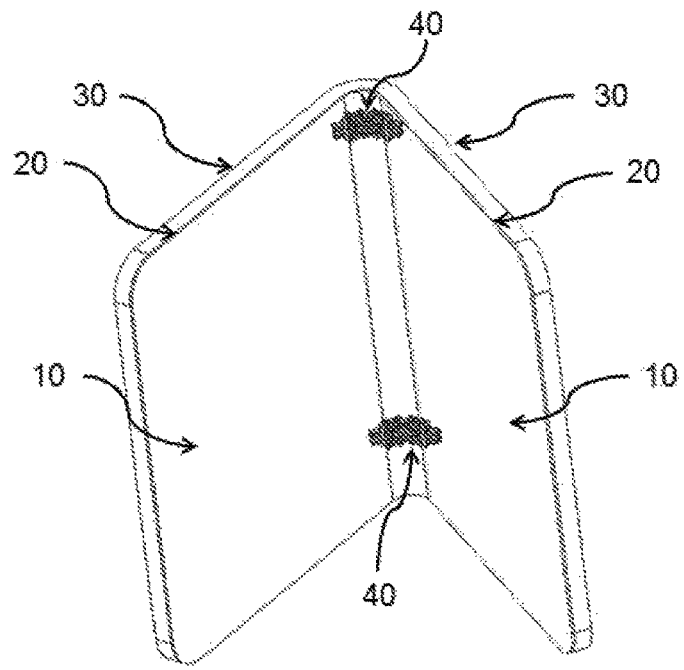
FIG. 1 is a perspective view illustrating an outer appearance of a flexible display device having a foldable module according to an exemplary embodiment.

In order to more clearly describe the embodiments of this disclosure or the conventional technical solutions, the description is used to make a simple introduction of the drawings used in the following embodiments. The following description of the drawings are merely some embodiments of this disclosure, and the direction terms mentioned in the present invention, such as "upper", "lower", "front", "rear", "left", "right", "top", "bottom", etc., are only with reference to the attached figures and by to illustrate the invention and not to limit the invention. In the drawings, structurally similar elements are given the same reference numerals.

The disclosure is directed to the technical problem that the foldable module and their assembled flexible display device of the prior art, may cause the display panel to be wrinkled during the folding process, and in the natural state of bending angle is not easy to maintain, bending angle and bending state is not to control. Therefore, the technical problem that affects the performance of the flexible display device can solve these disadvantages.

Referring to FIG. 1, FIG. 1 is a perspective view illustrating an outer appearance of a flexible display device having a foldable module according to an exemplary embodiment. As shown in FIG. 1, the flexible display device includes a flexible display panel 10 and a foldable module. The foldable module is provided for assembling to the flexible display panel 10, wherein the foldable module includes a metal frame 20 which may also be a metal plate and which is configured to attach the flexible display panel 10 thereto for fixing the flexible display panel 10. A protective housing 30 is configured to hold the flexible display panel 10 and the metal frame 20. A flexible hinge 40 is provided for securing on the protective housing 30. Herein, the metal frame 20 serves as a carrier for the flexible display panel 10, which has a shape-memory effect, a high elasticity, and a high toughness, and the shape-memory effect can quickly restore the flexible display device to its original shape. In addition, the metal frame 20 may be a polymer sheet, or a metal sheet; the hollow metal frame may be shaped with a middle strip which can be straight, zigzag-shaped or wave-shaped to increase the resilience thereof. The flexible display device can realize the function of bending and folding without generating wrinkles, and to achieve an arbitrary stop at a desired position within a predetermined angular range. Moreover, the protective housing 30 also reserves the installation space for components such as a battery, a motherboard, a camera and a flexible circuit board.

Figure 2A:
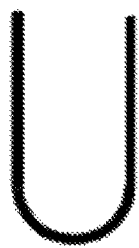
FIG. 2A is a schematic view illustrating a state where a flexible display device folds according to an exemplary embodiment.
Figure 2B:
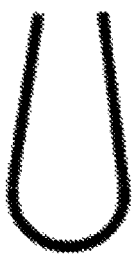
FIG. 2B is a schematic view illustrating a state where a flexible display device folds according to another exemplary embodiment.
Figure 2C:
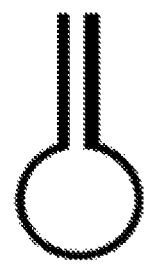
FIG. 2C is a schematic view illustrating a state where a flexible display device folds according to a further exemplary embodiment.

The flexible display device, depending on the different configurations of the foldable modules, can have different shapes of implementation. As shown in FIG. 2A, FIG. 2A is a schematic view illustrating a state where a flexible display device folds according to an exemplary embodiment. FIG. 2B is a schematic view illustrating a state where a flexible display device folds according to another exemplary embodiment. FIG. 2C is a schematic view illustrating a state where a flexible display device folds according to a further exemplary embodiment. Therefore, the flexible display device can be adjusted to have different forms, according to the actual needs and the types of the foldable module, which are not limited herein.

Figure 3:
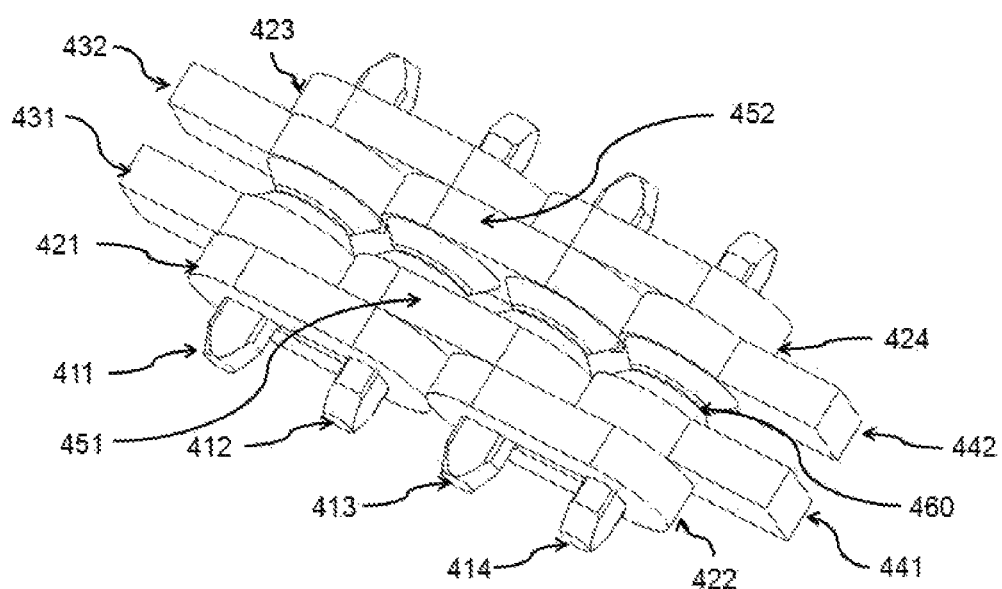
FIG. 3 is a perspective view illustrating a flexible hinge structure according to an exemplary embodiment.

Referring to FIG. 3, FIG. 3 is a perspective view illustrating a flexible hinge structure according to an exemplary embodiment of this disclosure is shown. As shown in FIG. 3, the preferred embodiment provides a flexible hinge assembled to the above flexible display device, which includes rotating shafts, fixed washers, biasing gaskets, movable washers, and disc springs. The rotating shafts at least include a first rotating shaft 411, a second rotating shaft 412, a third rotating shaft 413, and a fourth rotating shaft 414. The fixed washers at least include a first fixed washer 421, a second fixed washer 422, a third fixed washer 423, and a fourth fixed washer 424. The biasing gaskets at least include a first biasing gasket 431, a second biasing gasket 432, a third biasing gasket 441, and a fourth biasing gasket 442. The movable washers at least include a first movable washer 451, and a second movable washer 452. The rotating shafts are configured to axially engage the fixed washers, the biasing gaskets, the movable washers, and the disc springs, and are assembled therewith as a whole.

Figure 4:
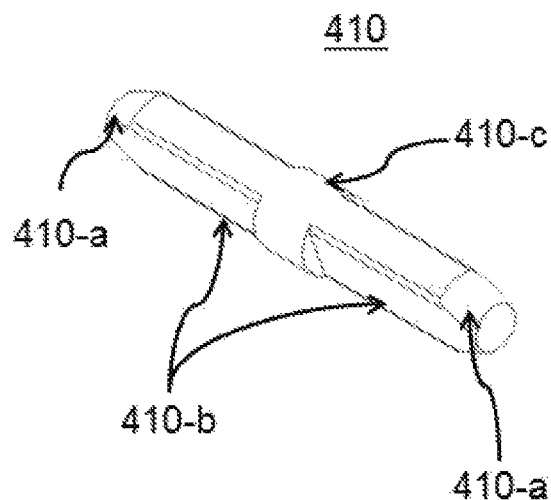
FIG. 4 is a perspective view illustrating a rotating shaft according to an exemplary embodiment.

Referring to FIG. 4, FIG. 4 is a perspective view illustrating a rotating shaft according to an exemplary embodiment of this disclosure. As shown in FIG. 4, the preferred embodiment provides rotating shafts 410 which include the first rotating shaft, the second rotating shaft, the third rotating shaft, and the fourth rotating shaft. Both ends of the rotating shaft 410 are provided with a chamfering 410-a to facilitate assembly, and a middle portion 410-c which is cylindrical for assembling with the disc spring 460. Both sides 410-b of the rotating shaft are configured as planes, for assembling with the fixed washers and the biasing gaskets or the movable washer, and a chamfer is arranged between two adjacent planes to facilitate assembly. The rotating shaft has a shaft diameter of 0.5 mm-3.0 mm.

Figure 5:
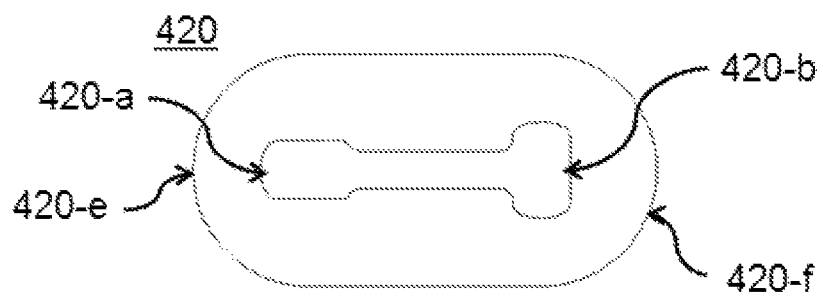
FIG. 5 is a front view illustrating a fixed washer according to an exemplary embodiment.
Figure 6:
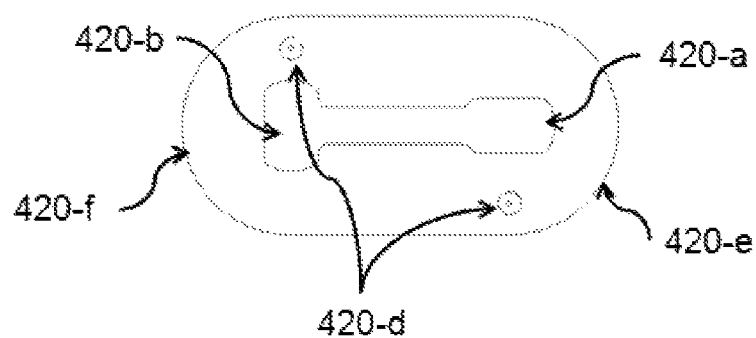
FIG. 6 is a rear view illustrating a fixed washer according to an exemplary embodiment.

Referring to FIG. 5, FIG. 5 is a front view illustrating a fixed washer according to an exemplary embodiment of this disclosure. As shown in FIG. 5, the preferred embodiment provides the fixed washer 420 which includes a first semicircular arc surface 420-e and a second semicircular arc surface 420-f, and the first semicircular arc surface 420-e and the second semicircular arc surface 420-f each have a wear resistance to a certain degree; and the fixed washer 420 has two rectangular perforations with different orientations. In this embodiment, preferably, the first perforation 420-a is in the horizontal direction and the second perforation 420-b is in the vertical direction. Moreover, the first perforation 420-a forms an included angle of 90° with the second perforation 420-b. The two perforations are formed to have an interference fit with the rotating shafts. The first perforation 420-a and the second perforation 420-b are communicated with each other by a connecting via hole, and the connecting via hole has a height which is smaller than heights of the first perforation 420-a and the second perforation 420-b. Referring to FIG. 6, FIG. 6 is a rear view illustrating a fixed washer according to an exemplary embodiment of this disclosure. As shown in FIG. 6, the preferred embodiment provides the back surface of the fixed washer which includes two small projections 420-d which are symmetric in respect to a center of the fixed washer, and are respectively located below the first perforation 420-a and above the second perforation 420-b. The small projection 420-d below the first perforation 420-a is used to form a tight fit with the biasing gasket.

Figure 7:
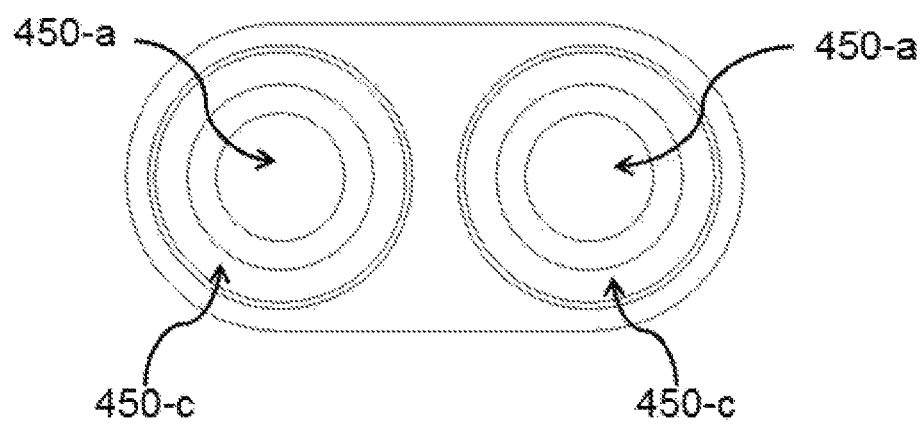
FIG. 7 is a front view illustrating a movable washer according to an exemplary embodiment.

Referring to FIG. 7, FIG. 7 is a front view illustrating a movable washer according to an exemplary embodiment of this disclosure. As shown in FIG. 7, in accordance with the preferred embodiment, two sides of the movable washer are formed as semicircular, arc sides, and the movable washer includes two centrally symmetrical fourth perforations 450-a for assembling the movable washer to the rotating shafts. The fourth perforations 450-a each define a shaft hole for assembling with a corresponding rotating shaft to form a clearance fit relationship therebetween. Moreover, there are two annular grooves 450-c in the front of the movable washer, which are respectively located at an outer periphery of the two fourth perforations 450-a for accommodating the small projections of the fixed washers. In other words, the annular groove 450-c corresponds to a moving position of the small projection 420-d above the perforation 420-b, so the depth of the annular groove is larger than the height of the small projection 420-d of the fixed washer.

Figure 8:
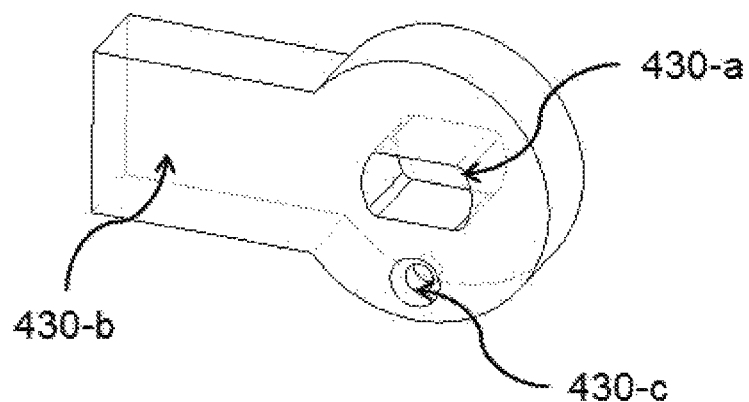
FIG. 8 is a perspective view illustrating a biasing gasket according to an exemplary embodiment.

Referring to FIG. 8, FIG. 8 is a perspective view illustrating a biasing gasket according to an exemplary embodiment of this disclosure. As shown in FIG. 8, in accordance with the preferred embodiment, one end of the biasing gasket is provided with a rectangular third perforation 430-a for assembling the biasing gasket to the rotating shaft. The third perforation 430-a defines a shaft hole for assembling with the rotating shaft to form an interference fit relationship therebetween. Moreover, the biasing gasket further includes a small circular hole 430-c corresponding to one of the small projections 420-d of the fixed washer, and forming a tight fit with the small projection to obtain a connecting function. Furthermore, the other end of the biasing gasket includes a handle 430-b for fixing to the protective housing 30 of the foldable module. Herein, the fixing method may be screwing, welding, hooking, or buckling, which is not limited herein.

Figure 9:
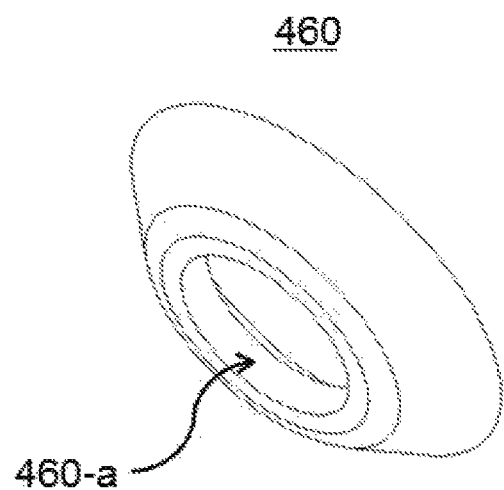
FIG. 9 is a perspective view illustrating a disc spring according to an exemplary embodiment.

Referring to FIG. 9, FIG. 9 is a perspective view illustrating a disc spring according to an exemplary embodiment of this disclosure. As shown in FIG. 9, in accordance with the preferred embodiment, the disc spring 460 includes a circular fifth perforation 460-a for assembling the disc spring 460 to the rotating shaft, and forming a shaft hole to engage with the rotating shaft. Moreover, the disc spring 460 can be selected with reference to industry standards. The main parameters include inner diameter, outer diameter, thickness, internal height, and external height of the disc spring. In the present embodiment, the disc spring 460 is configured by having at least two discs butting each other. Other combinations may be made according to actual situations, such as three horizontally stacked, or four cascaded together, or two horizontally stacked and cascaded with a third one. In the present embodiment, the disc spring 460 provides axial friction force according to tight fit of preloaded force, so that the flexible hinge can arbitrarily stop at a selected position within a predetermined angle range.

As described above, thicknesses of the fixed washer, the movable washer, the biasing gasket, and the disc spring in the flexible hinge according to the present invention should be the same, and the thickness t ranges from 0.1 mm to 2.0 mm.

Figure 10:
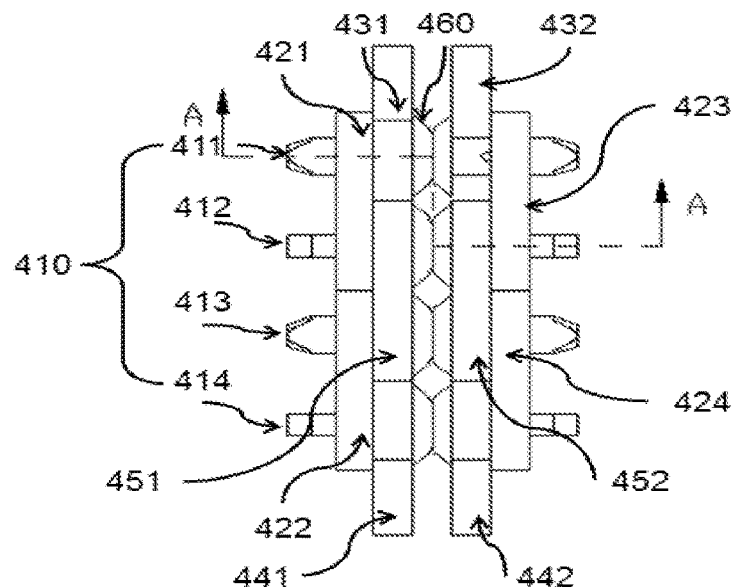
FIG. 10 is a side view illustrating the flexible hinge structure of FIG. 3, according to an exemplary embodiment.

Referring to FIG. 10, FIG. 10 is a side view illustrating the flexible hinge structure of FIG. 3, according to an exemplary embodiment of this disclosure. As shown in FIG. 10, in accordance with the preferred embodiment, the four rotating shafts 410 are put into a fixture (not shown in the drawing). In order to achieve foolproof, the fixture enables that the first rotating shaft 411 and the third rotating shaft 413 are kept at their same aspect, and the second rotating shaft 412 and the fourth rotating shaft 414 kept at their same aspect. Herein, the first rotating shaft 411 and the third rotating shaft 413 are offset by a certain angle of rotation relative to the second rotating shaft 412 and the rotating shaft 414. In this embodiment, the aspects are respectively horizontal and vertical aspects. Following the foregoing step, then, firstly, a first fixed washer 421 and a second fixed washer 422 are sequentially mounted; the first fixed washer 421 and the second fixed washer 422 are disposed in an interference fit with the rotating shafts 410, to ensure that there will be no relative rotation therebetween. Secondly, a first biasing gasket 431, a first movable washer 451, and a third biasing gasket 441 are sequentially mounted; the first biasing gasket 431 and the third biasing gasket 441 are disposed in an interference fit with the rotating shafts 410, to ensure that there will be no relative rotation therebetween, and the first movable washer 451 is in a clearance fit with the second rotating shaft 412 and the third rotating shaft 413. Then eight disc springs 460 are mounted and assembled to each of the rotating shafts 410 with each two disc spring 460 being back-to-back butting each other. The disc springs 460 form a clearance fit with the rotating shafts 410. And then, a second biasing gasket 432, a second movable washer 452 and a fourth biasing gasket 442 are sequentially mounted, and the second biasing gasket 432, the fourth biasing gasket 442 are disposed in an interference fit with the rotating shafts 410, to ensure that there will be no relative rotation therebetween, and the second movable washer 452 is in a clearance fit with the second rotating shaft 412 and the third rotating shaft 413. At last, a third fixed washer 423, and a fourth fixed washer 424 are sequentially mounted; the third fixed washer 423 and the fourth fixed washer 424 are disposed in an interference fit with the rotating shafts 410, to ensure that there will be no relative rotation therebetween.

Figure 11:
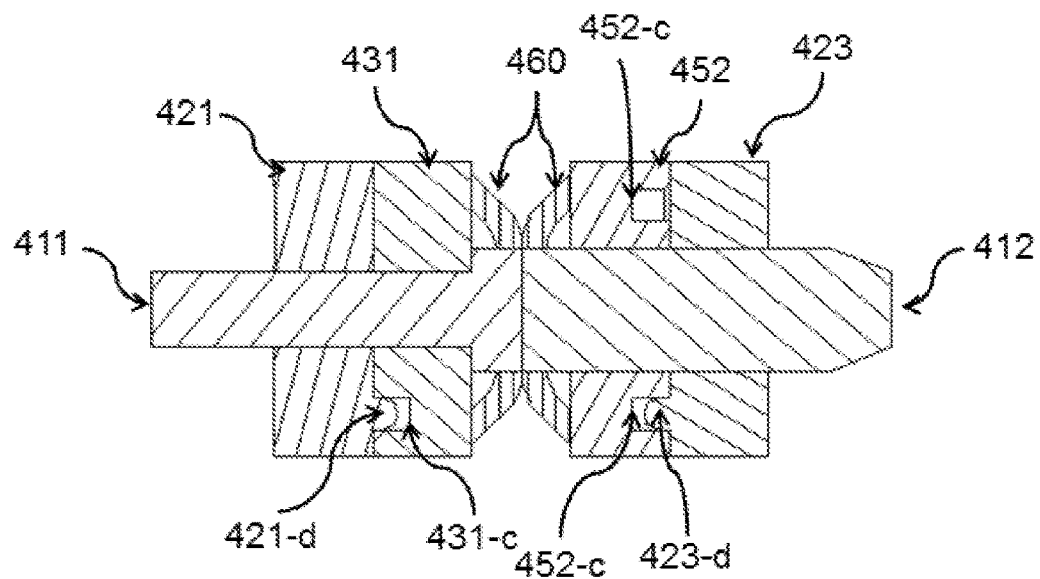
FIG. 11 is a cross-sectional view taken along line A-A of FIG. 10, according to an exemplary embodiment.

Referring to FIG. 11, FIG. 11 is a cross-sectional view taken along line A-A of FIG. 10, according to an exemplary embodiment of this disclosure. In accordance with the preferred embodiment, the third fixed washer 423 and the second movable washer 452 are mounted on the second rotating shaft 412, and the third fixed washer 423 includes two small projections 423-d, and the second movable washer 452 includes an annular groove 452-c corresponding to the small projection 423-d, so that the annular groove 452-c can accommodate the small projection 423-d. The first fixing washer 421 and the first biasing gasket 431 are assembled to the first rotation shaft 411, and the surface of the first fixing washer 421 is in contact with the first biasing gasket 431. There are two small projections 421-d. The first biasing basket 431 is provided with a small circular hole 431-c corresponding to the small projection 421-d. Therefore, the small projection 421-d is configured to tightly fit with the small circular hole 431-c.

Because both the biasing gasket and fixed washer are in interference fit with the corresponding rotating shafts, when the biasing gasket is rotated by an external force, the rotating shaft is caused to rotate, which in turn causes the fixed washer to rotate. Since corresponding semicircular, arc surfaces between two adjacent fixed washers have a predetermined degree of abrasion resistance, when the friction between the two corresponding semicircular, arc surfaces is greater than a predetermined value, the two adjacent fixed washers cooperate to form an engaging and an engaged relationship, and since the small projection of the fixed washer forms a tight fit with small circular hole of the biasing gasket, a positioning effect is achieved. The disc springs can provide axial friction according to the pre-tightening force of the tight fit, and thus produces an adjustable torque when assembled together. Accordingly, the present invention can achieve a certain degree of bending, and can maintain at the bent position. During the bending, a distance between the axis of two adjacent rotating shafts is kept constant.

The flexible hinge of the present embodiment may be expanded according to the actual situation, to be longitudinally extended to six axes, eight axes, . . . 2n axes, such as the rotation axes can have a number of six, eight or other number. In addition, the flexible hinge can expand in the width direction, and the fixed washers are still mounted on two outermost sides of the rotating shafts, and a corresponding number of movable washers, biasing gaskets and disc springs can be added in the middle, and the number thereof can be determined according to the actual situation, which is not limited herein.

The object of the disclosure to provide a foldable module and a flexible display device, which can solve the existing problems of the prior art foldable members and their assembled flexible display devices. In other words, the foldable module and the flexible display device according to the disclosure as constructed above has the following advantages: a bendable, flexible hinge with adjustable torque is achieved by having components having the interference fit, clearance fit and tight fit with each other. Furthermore, a metal frame or a metal plate having a shape-memory effect, high toughness, and high elasticity, functions as a carrier of a flexible display panel. Under the action of the positioning of the flexible hinge and the elasticity of the metal frame or the metal plate, it is able to achieve the function of bending and folding the display without causing formation of wrinkles thereof, thereby improving the performance of the flexible display device.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive. The above disclosed subject matter is to be considered illustrative, and not restrictive, and the appended claims are intended to cover all such modifications, enhancements, and other embodiments, which fall within the true spirit and scope of the present invention.

The invention claimed is:

1. A foldable module, comprising:
a metal frame disposed along a periphery of a flexible display panel;
a protective housing configured to hold the flexible display panel and the metal frame; and
a flexible hinge for securing to the protective housing to enable the housing and the flexible display panel to fold and position within a predetermined angular range;
wherein the flexible hinge includes rotating shafts, fixed washers, biasing gaskets, movable washers, and disc springs, the rotating shafts configured to axially engage the fixed washers, the biasing gaskets, the movable washers, and the disc springs, and assembled therewith as a whole, and a distance between axes of two adjacent rotating shafts being kept constant; and
wherein the fixed washers are configured to tight fit with the biasing gaskets and form an interference fit with the rotating shafts, the movable washers and the disc springs are configured to form a clearance fit with the rotating shafts, and
wherein the disc springs provide axial friction to effect that the flexible hinge is be able to be located within a predetermined angular range by adjusting torque; and wherein the rotating shafts each have a shaft diameter of 0.5 mm~3.0 mm, both ends of the rotating shaft each are provided with a chamfering, and a middle portion is cylindrical, for assembling with the disc springs, and both sides of the rotating shaft are configured as planes.

2. The foldable module according to claim 1, wherein the flexible hinge comprises at least four rotating shafts, each of which is configured to be arranged with at least two disc springs butting together, symmetrical sides of the butting disc springs each being provided with one movable washer and two biasing gaskets, forming four biasing gaskets arranged side by side on both ends of two movable washers, and wherein two of the fixed washers are provided at outer sides of the movable washer and the biasing gaskets so that the fixed washers are disposed to be staggered with respect to the movable washer and the biasing gaskets.

3. The foldable module according to claim 2, wherein the fixed washers and the biasing gaskets are each provided with a corresponding perforation which is a rectangular perforation for having an interference fit with a corresponding shaft, and wherein the fixing washers each include a first perforation and a second perforation that assume different orientations to each other, the biasing gaskets each include a third perforation.

4. The foldable module according to claim 3, wherein the fixed washers each are provided with two centrally symmetrical small projections in a side surface thereof facing the biasing gaskets, and wherein a side of each of the biasing gaskets is provided with a small circular hole corresponding to one of the small projections of the fixed washer, the small circular hole forming a tight fit with the one of the small projections.

5. The foldable module according to claim 4, wherein the movable washers each comprise two centrally symmetrical fourth perforations for forming a clearance fit with the rotating shafts, and an outer periphery of each of the fourth perforations has an annular groove for accommodating the other one of the small projections of the fixed washer.

6. The foldable module according to claim 2, wherein the fixed washers each have a semicircular arc face at each of both ends thereof, whose wear resistance is greater than a predetermined value, and the semicircular arc faces of the two adjacent fixed washers cooperate to form an engaging and engaged relationship, and wherein one end of each the biasing gaskets comprises a handle for fixing to the protective housing.

7. The foldable module according to claim 1, wherein a thickness of each of the fixed washers is 0.1 mm to 2.0 mm, and wherein the thickness of each of the fixing washers, the movable washers, the biasing gaskets, and the disc springs is substantially the same to each other.

8. A foldable module, comprising:
a metal frame disposed along a periphery of a flexible display panel;
a protective housing configured to hold the flexible display panel and the metal frame; and
a flexible hinge for securing to the protective housing to enable the housing and the flexible display panel to fold and position within a predetermined angular range;
wherein the flexible hinge includes rotating shafts, fixed washers, biasing gaskets, movable washers, and disc springs, the rotating shafts configured to axially engage the fixed washers, the biasing gaskets, the movable washers, and the disc springs, and assembled therewith as a whole, and wherein the fixed washers are configured to tight fit with the biasing gaskets and form an interference fit with the rotating shafts, the movable washers and the disc springs are configured to form a clearance fit with the rotating shafts, and wherein the disc springs provide axial friction to effect that the flexible hinge is be able to be located within a predetermined angular range by adjusting torque, and wherein the rotating shafts each have a shaft diameter of 0.5 mm~3.0 mm, both ends of the rotating shaft each are provided with a chamfering, and a middle portion is cylindrical, for assembling with the disc springs, and both sides of the rotating shaft are configured as planes.

9. The foldable module according to claim 8, wherein the flexible hinge comprises at least four rotating shafts, each of which is configured to be arranged with at least two disc springs butting together, symmetrical sides of the butting disc springs each being provided with one movable washer and two biasing gaskets, forming four biasing gaskets arranged side by side on both ends of two movable washers, and wherein two of the fixed washers are provided at outer sides of the movable washer and the biasing gaskets so that the fixed washers are disposed to be staggered with respect to the movable washer and the biasing gaskets.

10. The foldable module according to claim 9, wherein the fixed washers and the biasing gaskets are each provided with a corresponding perforation which is a rectangular perforation for having an interference fit with a corresponding shaft, and wherein the fixing washers each include a first perforation and a second perforation that assume different orientations to each other, the biasing gaskets each include a third perforation.

11. The foldable module according to claim 10, wherein the fixed washers each are provided with two centrally symmetrical small projections in a side surface thereof facing the biasing gaskets, and wherein a side of each of the biasing gaskets is provided with a small circular hole corresponding to one of the small projections of the fixed washer, the small circular hole forming a tight fit with the one of the small projections.

12. The foldable module according to claim 11, wherein the movable washers each comprise two centrally symmetrical fourth perforations for forming a clearance fit with the rotating shafts, and an outer periphery of each of the fourth perforations has an annular groove for accommodating the other one of the small projections of the fixed washer.

13. The foldable module according to claim 9, wherein the fixed washers each have a semicircular arc face at each of both ends thereof, whose wear resistance is greater than a predetermined value, and the semicircular arc faces of the two adjacent fixed washers cooperate to form an engaging and engaged relationship, and wherein one end of each the biasing gaskets comprises a handle for fixing to the protective housing.

14. The foldable module according to claim 8, wherein a thickness of each of the fixed washers is 0.1 mm to 2.0 mm, and wherein the thickness of each of the fixing washers, the movable washers, the biasing gaskets, and the disc springs is substantially the same to each other.

\* \* \* \* \*